United States Patent [19]

Shioya et al.

[11] Patent Number: 5,017,550
[45] Date of Patent: May 21, 1991

[54] METHOD FOR PRODUCING THIN FILM OF OXIDE SUPERCONDUCTOR

[75] Inventors: Jun Shioya; Yoichi Yamaguchi; Akira Mizoguchi; Noriyuki Yoshida; Kenichi Takahashi; Kenji Miyazaki; Satoshi Takano; Noriki Hayashi, all of Osaka, Japan

[73] Assignee: Sumitomo Electric Industries, Ltd., Osaka, Japan

[21] Appl. No.: 175,214

[22] Filed: Mar. 30, 1988

[30] Foreign Application Priority Data

Mar. 30, 1987 [JP] Japan .................................. 62-79354
Mar. 30, 1987 [JP] Japan .................................. 62-79355
Mar. 31, 1987 [JP] Japan .................................. 62-80426
Aug. 21, 1987 [JP] Japan .................................. 62-208925

[51] Int. Cl.$^5$ ......................... B05D 5/12; B05D 3/06; C23C 16/00
[52] U.S. Cl. ....................................... 505/1; 505/732; 505/704; 427/38; 427/62; 427/42; 427/255.3; 427/126.3; 427/117
[58] Field of Search .................. 427/42, 62, 63, 255.3, 427/117, 126.3, 38; 29/599; 505/1, 732, 704

[56] References Cited

U.S. PATENT DOCUMENTS 4,430,366  2/1984  Crawford et al. .................... 427/42
4,861,750  8/1989  Nogawa et al. ........................ 505/1

FOREIGN PATENT DOCUMENTS 282839    9/1988  European Pat. Off. .
2469005   5/1981  France .
2602246   2/1988  France .
55-65358  5/1980  Japan .

OTHER PUBLICATIONS

Bednorz et al., "Possible High Tc Superconductivity in the Ba-La-Cu-O System", Z. Phys. B-Condensed Matter 64,189-192 (1986).
Hammond et al., "Superconducting Thin Films of the Perovskite Superconductors by Electron-Beam Deposition".
Extended Abstracts, "High Temperature Superconductors", Edited by Gubser et al., Apr., 1987, pp. 169-171.
Hammond, "Synthesis and Physical Properties of Superconducting Compound Films formed by the Electron-Beam Codeposition of the Elements", J. Vac. Sci. Technol. 15(2), pp. 382-385, 1978.
Cava et al, "Bulk Superconductivity at 36k in $La_{1.8}Sr_{0.2}CuO_4$", Phys. Rev. Lett., vol. 58(4), Jan. 1987, pp. 408-410.
Hoffman et al, "Effect of Substrate Potential on $Al_2O_3$ Films Prepared by Electron Beam Evaporation", J. Vac. Sci. Tech., vol. 9(1), 1972, pp. 326-329.
P. J. Martin et al., "Ion-Beam-Assisted Deposition of Thin Films", *Applied Optics*, vol. 22, No. 1, Jan. 1, 1983, pp. 178-184.
M. K. Wu et al., "Superconductivity at 93 K in a New Mixed-Phase Y-Ba-Cu-O Compound System at Ambient Pressure", *Physical Review Letters*, vol. 58, No. 9, Mar. 2, 1987, pp. 908-910.

Primary Examiner—Norman Morgenstern
Assistant Examiner—Roy V. King
Attorney, Agent, or Firm—Wegner, Cantor, Mueller & Player

[57]   ABSTRACT

A thin film of an oxide superconductor having a homogeneous composition and less oxygen defects is produced by independently vaporizing onto a substrate at least one material selected from the group consisting of the elements of Ia, IIa and IIIa groups of the periodic table and their compounds and one material selected from the group consisting of Cu and its compounds and irradiating the substrate with oxygen ions and depositing the vaporized materials together with oxygen on the substrate to form the thin film of the oxide superconductor.

9 Claims, 3 Drawing Sheets

METHOD FOR PRODUCING THIN FILM OF OXIDE SUPERCONDUCTOR

BACKGROUND OF THE INVENTION

1. Field of the Invention

The present invention relates to a method for producing an oxide superconductor film.

2. Description of the Related Art

Various types of superconductors such as metallic, ceramic or organic superconductors have been known for a long time. Recently, oxide superconductors having very high critical temperatures (Tc) have attracted much attention. Generally, the oxide superconductor is prepared by drying powdery oxides or carbonates of constituent elements, then repeating press molding, presintering and grinding several times and finally press molding and sintering the ground presintered material. In this method, to produce a homogeneous dense sintered product, troublesome steps must be repeated, and the sintered product has a limited thickness. Therefore, a thin film of superconductor cannot be produced by the sintering method.

To make use of unique properties of the oxide superconductor, many methods have been proposed for producing its thin film. For example, in vacuum deposition, the superconductor forming oxides are heated and evaporated under reduced pressure and deposited.

In the production of the oxide superconductor, a content of oxygen in the superconductor has a great influence on the characteristics of the superconductor. In case of a multicomponent oxide such as the oxide superconductor, when a thin film of an oxide is formed by the vacuum deposition, the composition of the deposited oxide greatly deviates from that of the raw material oxides because the oxides have different vapor pressure from each other. In addition, the oxides may be decomposed into metal elements and elemental oxygen. Therefore, from the obtained superconductor, a part of the oxygen which is required to impart the superconductive properties to the material is eliminated so that the composition of the superconductor suffers from shortage of oxygen. Therefore, the thin film of the superconductor formed by the vacuum deposition has an inhomogeneous composition and cannot have satisfactory superconductive properties.

When the superconductor is used for a power transmitting material, it should be processed in the form of an elongate body. However, it has been impossible to form a practically useful elongate body of superconductor by the conventional method such as the sintering method.

SUMMARY OF THE INVENTION

One object of the present invention is to provide a method for producing a thin film of an oxide superconductor having a homogeneous composition and good superconductive properties from multicomponent raw materials.

Another object of the present invention is to provide a method for effectively producing an elongate ceramic body having a continuous film of an oxide superconductor thereon.

Accordingly, the present invention provides a method for producing a thin film of an oxide superconductor comprising independently vaporizing at least one material selected from the group consisting of the elements of Ia, IIa and IIIb groups of the periodic table and their compounds and at least one material selected from the group consisting of the elements of Ib, IIb and IIIa groups of the periodic table and their compounds in the presence of molecular oxygen or oxygen ions and depositing the vaporized materials together with oxygen on a substrate to form a thin film of the oxide superconductor.

DETAILED DESCRIPTION OF THE INVENTION

Figure 1:
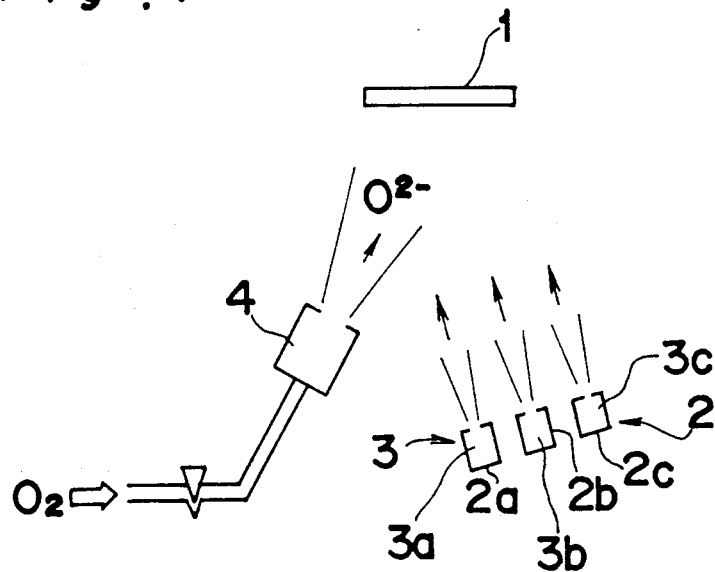
FIG. 1 schematically shows a vacuum deposition apparatus used in one embodiment of the method for producing a thin film of an oxide superconductor according to the present invention, FIG. 2 schematically shows an apparatus used in another embodiment of the method for producing a thin film of an oxide superconductor according to the present invention.

According to the present invention, since the elements or their compounds are independently vaporized, the elements reach the surface of the substrate in substantially the same ratio as contained in the raw materials. When the elements are used, they are vaporized in the presence of the molecular oxygen or oxygen ions, and oxygen is supplied during the formation of superconductor, so that the thin film of the oxide superconductor having a homogeneous composition can be produced. When the compounds of the elements such as oxygen containing compounds (e.g. oxides) of the elements are used, they may be decomposed so that the oxygen is eliminated during vaporization and deposition. According to the present invention, since the compounds are vaporized in the presence of molecular oxygen or oxygen ions, oxygen is supplied during deposition so that the thin film of the oxide superconductor having less oxygen defects and a homogeneous composition is formed.

The method of the present invention is useful for the production of a thin film of an oxide superconductor having a composition of the formula:

$$M^1{}_xM^2{}_{1-x}M^3O_3 \qquad (I)$$

or

$$M^1{}_yM^2{}_{2-y}M^3O_4 \qquad (II)$$

wherein $M^1$ and $M^2$ are elements independently selected from the elements of the Ia, IIa and IIIa groups of the periodic table and $M^3$ is an element selected from the elements of the Ib, IIb and IIIa groups of the periodic table. Particularly, the method of the present invention is useful for the production of thin film of the superconductor having the composition (I) or (II) wherein $M^1$ and $M^2$ are elements independently selected from the elements of IIa and IIIb groups of the periodic table and $M^3$ is an element selected from the elements of the Ib group of the periodic table, preferably copper.

In the method of the present invention, the source material may be a pure element which constitutes the superconductor or a compound of such element. Examples of the elements are those of Ia, IIa and IIIb groups of the periodic table, those of Ib, IIb and IIIa groups of the periodic table and oxygen, nitrogen, fluorine, chlorine, carbon and sulfur.

Examples of the Ia group elements are Li, Na, K, Rb, Cs and Fr, and examples of the Ib group elements are Cu, Ag and Au.

Examples of the IIa group elements are Be, Mg, Ca, Sr, Ba and Ra, and examples of the IIb group elements are Zn, Cd and the like.

Examples of the IIIb group elements are Sc, Y and lanthanides (e.g. La, Ce, Pr, Nd, Pm, Sm, Eu, Gd, Tb, Dy, Ho, Er, Tm, Yb and Lu) and actinides (e.g. Ac, Th, Pa and Cf), and examples of IIIa group elements are Al, Ga, In and Tl.

Among the above exemplified elements, those selected from the Ib group elements, the IIa group elements, the IIIb group elements, lanthanides and oxygen are preferred. Among the Ib group elements, Cu is more preferred, among the IIa group elements, Sr and Ba are more preferred and among the IIIb group elements, Sc, Y and La are more preferred.

Examples of the compounds of the elements are chlorides, nitrides, carbides, sulfides and fluorides. Preferably, oxides and carbonates, particularly oxides are used.

The kinds of the elements and/or the compounds are selected according to the desired characteristics of the thin film of the oxide superconductor.

As the substrate, ceramic substrates (e.g. alumina, zirconia, boron nitride, etc.), glass substrates (e.g. quartz glass), semiconductor substrates (e.g. silicone), metal substrates (e.g. stainless steel) and the like are used.

One embodiment of the method of the present invention will be explained by making reference to FIG. 1 which schematically illustrates vacuum deposition.

In order to independently evaporate elements or compounds 3 towards a substrate 1, plural crucibles are placed in a chamber (not shown) kept in high vacuum. In each crucible 2a, 2b and 2c, respective element 3a, 3b and 3c is contained and independently heated to vaporize. The number of the crucible is selected based on the number of elements and/or compounds necessary for forming the desired superconductor. By heating each element or compound under conditions according to the vapor pressure of the respective element or compound, compositions of the vaporized element or compound and of the superconductor deposited on the substrate can be controlled. The heating condition may vary with not only the vapor pressure of the element or compound but also a growth rate, thickness and the like of the superconductor to be deposited.

The element or compound in the crucible may be heated by any conventional method such as resistance heating, electron beam heating and induction heating.

By the above procedure, the elements or the compounds are vaporized towards the substrate 1. Simultaneously with the vaporization of the elements or the compounds, oxygen ions are injected towards the substrate 1 in order to form the uniform thin film of the oxide superconductor containing an adequate amount of oxygen and having a homogeneous composition and improved characteristics. The oxygen ions are supplied from an oxygen ion source 4 in which molecular oxygen is ionized by, for example, application of electric field.

The amount of the supplied oxygen ions varies not only with the kinds of the elements or the compounds to be evaporated but also with an oxygen content in the compounds. Further, it varies with the vapor pressure of the elements or the compounds, ease of decomposition of the compounds and so on.

By supplying the oxygen ions together with the evaporation of the elements or the compounds, the elements or the compounds can be vaporized towards the substrate in an atomic ratio corresponding to the atomic ratio of elements in the superconductor to be formed. That is, when the elements or the compounds have different vapor pressures from each other, the heating condition for each element or compound can be selected according to the vapor pressure thereof so that the elements or the compounds are vaporized in a desired atomic ratio and the composition of the vaporized materials can be controlled. If the oxygen atoms are liberated from the oxygen-containing compound, oxygen is resupplied by the oxygen ions. Therefore, the composition of the deposited superconductor does not deviated from that of the source materials and the superconductor has less oxygen deficiency, so that the thin film of the oxide superconductor is homogeneous and has better superconductive properties.

In the above embodiment, when the elements are used as the source materials, the evaporated elements are preferably ionized by an ionization apparatus, although the thin film of superconductor having improved properties can be produced by simply vaporizing the elements. The vaporized elements may be ionized by any of conventional methods for ionizing a vaporized material such as an ion plating method, a direct current method in which plasma is formed around a substrate which acts as a cathode and the vaporized material is passed through the plasma, a high frequency method in which the vaporized material is ionized by a high frequency coil placed between the material source and the substrate, a cluster ion beam method in which the vaporized material is ionized by an ionizing grid and a hot cathode and a hot cathode method. In this case, when oxygen gas is supplied together with the vaporized materials, molecular oxygen is simultaneously ionized. Therefore, the oxygen ion source 4 is not necessarily used. However, the oxygen ion source 4 is preferably used so as to produce the thin film of the superconductor having better properties since the oxygen ions are continuously supplied by the source 4.

The elements or the compounds may be vaporized by other physical vapor deposition methods such as molecular beam epitaxy, sputtering, ion plating etc.

Another embodiment of the method of the present invention will be explained by making reference to FIG. 2.

Figure 2:
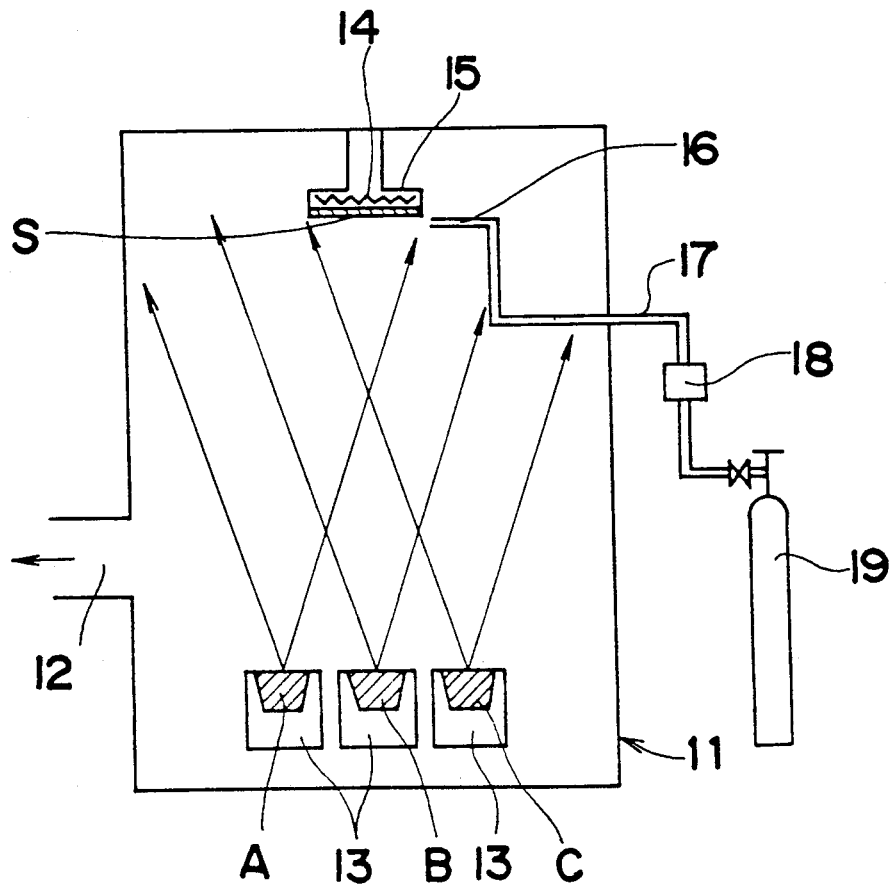

In an apparatus of FIG. 2, a growth chamber 11 has a suction outlet 12 which is connected to an ultra-high vacuum pump (not shown). At a lower part of the growth chamber 11, crucibles 13 containing the source materials A, B and C are placed, and at an upper part of the chamber 11, a holder 15 having a heater 15 is placed. On the lower surface of the holder 15, a substrate S is attached. Near the substrate S, a nozzle 16 is placed for supplying oxygen gas. The nozzle is connected to an oxygen bomb 19 through a pipe 17 and an oxygen flow controller 18.

The compounds of elements of the IIIa group, the IIa group and the Ib group are charged in three crucibles 13, respectively and heated to a temperature of several hundred to 2,500° C., for example, by electron beam heating, graphite heater, high frequency and IR while keeping the interior pressure of the chamber 11 at a pressure of $10^{-10}$ to $10^{-11}$ Torr. so as to vaporize the compounds.

As the substrate S, a ceramic plate is attached to the holder 15 and heated at a temperature of 900° to 1,100° C. by the heater 14. On the surface of the substrate S, oxygen gas is supplied from the nozzle 16 so as to increase an oxygen concentration near the substrate S. The oxygen may be ionized so that oxygen ions are supplied near the surface of the substrate S.

The vaporized materials are deposited together with oxygen on the surface of the substrate S to form the thin film of the oxide superconductor.

When a wire substrate is used in place of the plate form substrate S, a composite superconductive wire can be easily produced.

When the substrate S is masked and the thin layer of the oxide superconductor is formed thereon, a superconductive circuit can be formed on the substrate by removing the mask from the substrate or by leaving the mask on the substrate.

Figure 3:
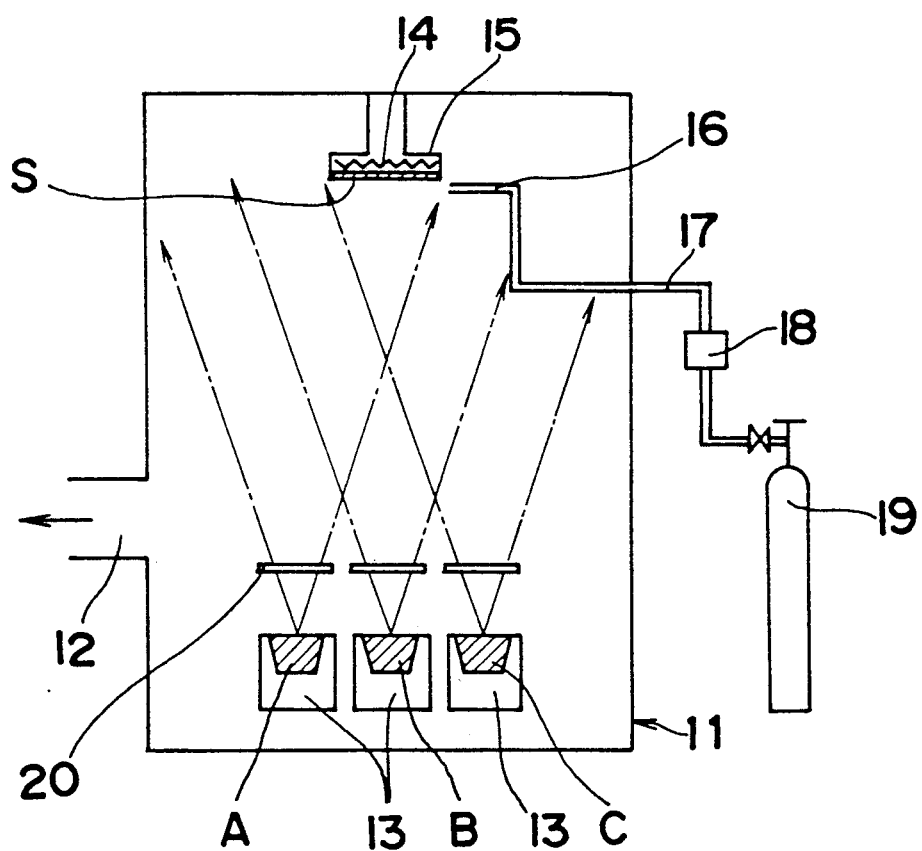
FIG. 3 is a modification of the apparatus of FIG. 2, and FIG. 4 schematically shows an apparatus used in a further embodiment of the method for producing a thin film of an oxide superconductor according to the present invention.

Further embodiment of the method of the present invention will be explained by making reference to FIG. 3. The apparatus of FIG. 3 is substantially the same as that of FIG. 2 except that shutters 20 are provided over the respective crucibles 13. Each shutter is opened when the vapor pressure of the element or the compound contained in the crucible 13 reaches a sufficiently high pressure.

The method of the present invention is useful for producing a switching element which is used in the electronics field, a storage element, a flux sensor, amplifier element, etc.

Hereinafter, a method of the present invention for producing a superconductive elongate body will be explained.

Figure 4:
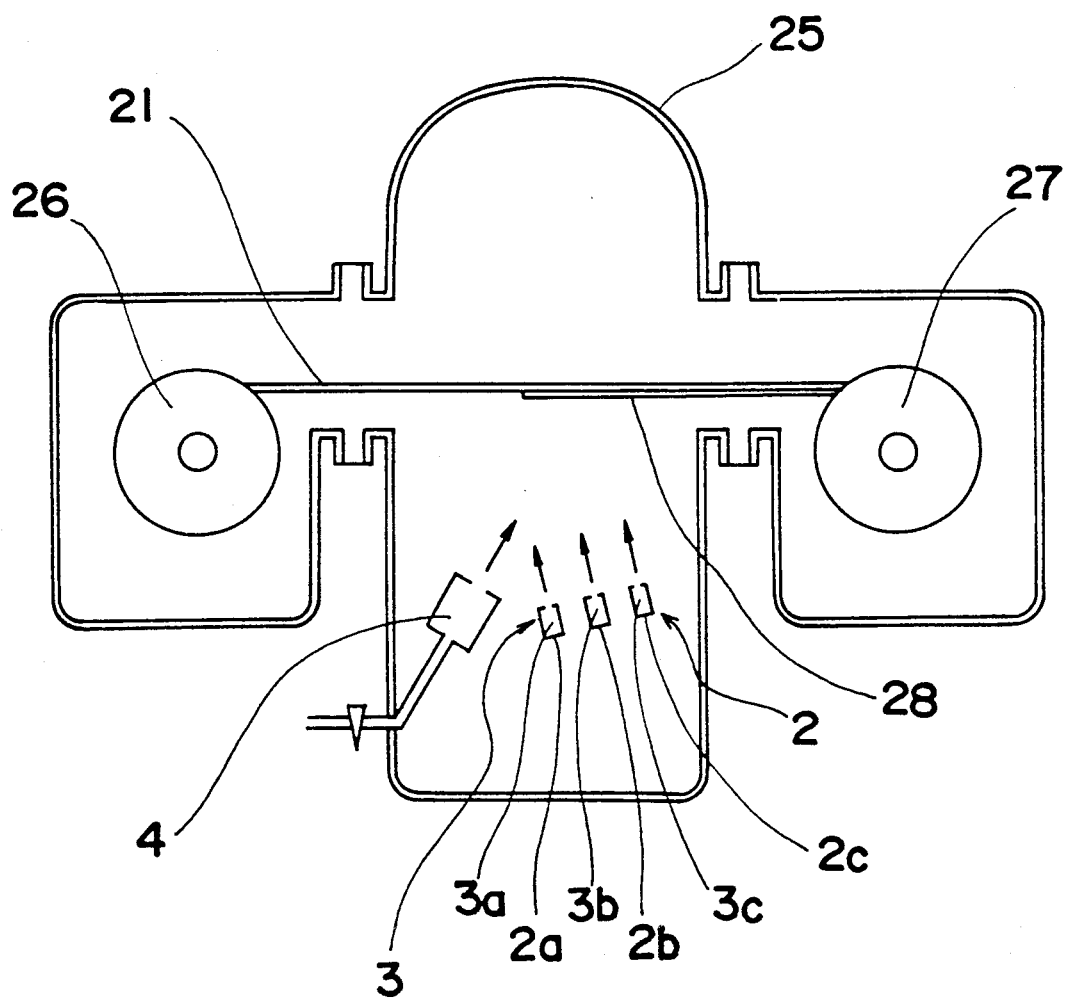

FIG. 4 schematically shows an apparatus used for producing a superconductive elongate body according to the present invention.

In a vacuum chamber 25, a ceramic elongate substrate 21 is supplied from a supply roll 26. Then, on one surface of the substrate 21, a thin film 28 of an oxide superconductor is formed and the substrate is wound by a take-up reel 27. In the chamber 25 the interior of which is kept at high vacuum, crucibles 2 containing the source materials 3 are placed as in FIG. 1. By heating the crucibles 2a, 2b and 2c independently, the elements or the compounds 3a, 3b and 3c are independently vaporized towards the substrate 21. The conditions for vaporizing the elements or the compounds are the same as in the embodiment of FIG. 1.

As the ceramic elongate substrate, a flexible ceramic such as zirconia, alumina, magnesium oxide and strontium titanate can be used. Those containing several percents of yttrium oxide for increasing flexibility also can be used.

The elongate substrate may be of any shape, for example, a tape, a round wire and the like. In view of strength and flexibility, preferably the tape has a thickness of 30 to 500 $\mu$m, and the round wire has a diameter of 30 to 500 $\mu$m. Examples of the tape form flexible ceramics are a zirconia tape having flexural strength (at 25° C.) of 1,100 kg/cm$^2$, surface roughness $R_a$ of about 0.3 $\mu$m and $R_{max}$ of about 2 $\mu$m and an alumina tape having flexural strength of 3,300 kg/cm$^2$, surface roughness $R_a$ of about 0.3 $\mu$m and $R_{max}$ of about 3 $\mu$m. When the tape form ceramic substrate is used, the total thickness of the substrate and the thin film of superconductor is preferably not larger than 500 $\mu$m, more preferably not larger than 55 $\mu$m. When the round wire form ceramic substrate is used, diameter of the wire having the thin film of superconductor is preferably not larger than 500 $\mu$m, more preferably not larger than 55 $\mu$m.

By the method of the present invention for producing the elongate body having the thin film of superconductor, not only the power transmitting medium but also a switching element, a storage element, a flux sensor and an amplifier element can be produced.

The present invention will be explained further in detail by following Examples.

EXAMPLE 1

The apparatus of FIG. 1 was used. La$_2$O$_3$, BaO and CuO were charged in the crucibles 2a, 2b and 2c, respectively, and the chamber was evacuated to $5 \times 10^{-7}$ Torr.

To independently control the vapor pressure of the above materials, the crucibles were independently heated. Namely, the crucible 2a containing La$_2$O$_3$ was heated at a temperature between 1,800K and 2,000K, the crucible 2b containing BaO was heated at a temperature between 1,300K and 1,500K, and the crucible 2c containing CuO was heated at a temperature between 1,000K and 1,300K. Thereby, the materials were evaporated towards the substrate 1. Simultaneously, from the oxygen ion source 4, oxygen ions were supplied towards the substrate 1 under the maximum current density of 10 A/m$^2$ to form a thin film of an oxide superconductor.

EXAMPLE 2

By using the same apparatus as in Example 1, La, Ba and Cu were charged in the crucibles 2a, 2b and 2C, respectively. Then, the crucible 2a containing La was heated at a temperature between 1,400K and 1,600K, the crucible 2b containing Ba was heated at a temperature between 500K and 700K, and the crucible 2c containing Cu was heated at a temperature between 1,000K and 1,200K. Thereby, the materials were evaporated towards the substrate 1. Simultaneously, from the oxygen ion source 4, oxygen ions were supplied towards the substrate 1 under the same condition as in Example 1 to form a thin film of an oxide superconductor.

Properties of the thin films of the oxide superconductor formed in Examples 1 and 2 were analyzed by an electron microscope and elemental analysis. The both thin films of the oxide superconductor had homogeneous compositions and good electrical properties.

EXAMPLE 3

The apparatus of FIG. 2 was used. La$_2$O$_3$, SrCO$_3$ and CuO were charged in the respective crucibles 13 and the chamber was evacuated to $10^{-10}$ to $10^{-11}$ Torr.

A quartz substrate was attached to the holder 15 and heated at about 1,000° C. with oxygen flowing onto the substrate surface at a flow rate of 10 cc/min. Simultaneously, La$_2$O$_3$ was heated at about 2,400° C., SrCO$_3$ was heated at about 2,200° C., and CuO was heated at about 980° C. by electron beam. Thereby, the materials were evaporated towards the substrate and deposited on the substrate to form a thin film of La-Sr-Cu-O type ceramic oxide superconductor having a thickness of about 1 $\mu$m. Its onset temperature was about 50K.

EXAMPLE 4

The apparatus of FIG. 3 was used. La, Sr and Cu were charged in the respective crucibles 13 and the chamber was evacuated to $10^{-10}$ to $10^{-11}$ Torr.

A quartz substrate was attached to the holder 15 and heated at about 1,000° C., with oxygen flowing onto the substrate surface at a flow rate of 10 cc/min. Simultaneously, La was heated at a temperature between 1,100° and 1,300° C., Sr was heated at a temperature between 800° to 900° C., and Cu was heated at a temperature between 1,800° to 2,000° C. by electron beam. Thereby, the materials were evaporated towards the substrate and deposited on the substrate to form a thin film of La-Sr-Cu-O type superconductor having a thickness of about 1 μm. Its onset temperature was about 50K.

EXAMPLE 5

The apparatus of FIG. 4 was used. $La_2O_3$, BaO and CuO were charged in the crucibles 2a, 2b and 2c, respectively and the chamber was evacuated to $1 \times 10^{-7}$ Torr.

To independently control the vapor pressure of the above materials, the crucibles were independently heated. Namely, the crucible 2a containing $La_2O_3$ was heated at a temperature between 1,800K and 2,000K, the crucible 2b containing BaO was heated at a temperature between 1,300K and 1,500K, and the crucible 2c containing CuO was heated at a temperature between 1,000K and 1,300K. Thereby, the materials were evaporated towards the substrate 21. In this Example, as the substrate 21, a zirconia tape having a width of 3 mm and a thickness of 50 μm was used and unwound from the reel 26 at a rate of 0.17 cm/min. Simultaneously with the evaporation of the source materials, from the oxygen ion source 4, oxygen ions were supplied towards the substrate 21 under the maximum current density of 10 A/m² to form a thin film of oxide superconductor having a thickness of 0.9 μm. Then, the substrate having the thin film of the superconductor was wound by the reel 27.

The temperature-resistance characteristics of the thus formed thin film of the superconductor was measured to find that the film has superconductive properties at a temperature higher than 77K which is the boiling temperature of liquid nitrogen.

The formed superconductive elongate body was not cracked or broken and its superconductive properties were not lost even when it was bent to a radius of curvature of 30 cm.

EXAMPLE 6

By using the same apparatus as used in Example 5, La, Ba and Cu were charged in the crucibles 2a, 2b and 2c, respectively.

In the same manner as in Example 5, the crucibles were independently heated. Namely, the crucible 2a containing La was heated at a temperature between 1,400K and 1,600K, the crucible 2b containing Ba was heated at a temperature between 500K and 700K, and the crucible 2c containing Cu was heated at a temperature between 1,100K and 1,200K. Thereby, the materials were evaporated towards the substrate 21. Simultaneously, from the oxygen ion source 4, oxygen ions were supplied towards the substrate 1 under the same condition as in Example 5. The substrate was the same as in Example 5.

The formed superconductive elongate body had superconductive properties at a temperature higher than 77K. The thin film was not cracked or broken and its superconductive properties were not lost even when it was bent to a radius of curvature of 30 cm.

The properties of the superconductors formed in Examples 5 and 6 were examined by an electron microscope and elemental analysis to find that both had homogeneous compositions. Their crystal structures were analyzed by X-ray diffraction and assumed to be a layered perovskite structure which is a typical crystal structure of a high temperature oxide superconductor.

What is claimed is:

1. A method for producing a thin film of an oxide superconductor comprising independently vaporizing at least one first material selected from the group consisting of Y, lanthanides and their compounds, at least one second material selected from the group consisting of Ca, Sr and Ba and their compounds, and one third material selected from the group consisting of Cu and its compounds, ionizing the vaporized materials and irradiating a substrate with oxygen ions to deposit the vaporized materials together with oxygen on the substrate to form the thin film of the oxide superconductor.

2. The method according to claim 1, wherein at least one of the materials is an oxide.

3. The method according to claim 2, wherein the first material is an oxide selected from the group consisting of $La_2O_3$, $Y_2O_3$ and $Sc_2O_3$.

4. The method according to claim 1, wherein the second material is a carbonate selected from the group consisting of $Ba_2CO_3$, $SrCO_3$ and $CaCO_3$.

5. The method according to claim 2, wherein the third material is CuO.

6. The method according to claim 1, wherein the oxide superconductor has a composition of the formula:

or

wherein $M^1$ and $M^2$ are elements independently selected from the group consisting of Y, lanthanides, Ca, Sr and Ba and $M^3$ is Cu.

7. The method according to claim 1, wherein the substrate is made of a flexible elongate ceramic body.

8. The method according to claim 7, wherein the flexible elongate ceramic body is a tape.

9. The method according to claim 7, wherein the flexible elongate ceramic body is a round wire.

* * * * *